United States Patent [19]

Clark et al.

[11] Patent Number: 5,424,095
[45] Date of Patent: Jun. 13, 1995

[54] CERAMIC VAPOR DEPOSITED COATING USING A STEAM-CONTAINING CARRIER GAS AND NON-ALKOXY SILANE PRECURSORS

[75] Inventors: Terence Clark, Princeton; Richard Cruse; Stephen Rohman, both of Kendall Park; Robert Mininni, Stockton, all of N.J.

[73] Assignees: Eniricerche S.p.A.; Enichem S.p.A., both of Milan, Italy

[21] Appl. No.: 206,857

[22] Filed: Mar. 7, 1994

[51] Int. Cl.6 .......................... B05D 7/22; C23C 16/00
[52] U.S. Cl. ..................................... 427/237; 427/238; 427/239; 427/248.1; 427/255
[58] Field of Search ..................... 427/237, 238, 248.1, 427/255, 239

[56] References Cited

U.S. PATENT DOCUMENTS 4,099,990  7/1978  Brown et al. .
5,208,069  5/1993  Clark et al. ........................ 427/226

FOREIGN PATENT DOCUMENTS 9003452  4/1990  WIPO .

OTHER PUBLICATIONS

Maury et al, "OMCVD of silicon carbide nitride mixtures using various organosilazane precursors", Proc. Eur. Conf. Chem. Vap. Deposition, 6th, Edited by Porat (1987) pp. 390–397 (Abstract).

Obfescu et al, "Chemical vapor deposition of amorphous layers of the type $Si_xN_y/Si_xN_yH_z$", Rom. R0101060B1, Nov. 26, 1992 (Abstract).

D. E. Brown et al., "Inhibition of Coke Formation in Ethylene Steam Cracking", *Coke Formation on Metal Surfaces*, Edited by Lyle F. Albright et al., American Chemical Society Series 202, p. 2, 1982.

Based on a symposium jointly sponsored by The ACS Divisions of Petroleum and Industrial and Engineering Chemistry at the 182nd Meeting of the ACS, N.Y., N.Y., Aug. 23–28, 1981.

*Primary Examiner*—Roy V. King
*Attorney, Agent, or Firm*—Oblon, Spivak, McClelland, Maier & Neustadt

[57] ABSTRACT

In order to reduce the rate of coke formation during the industrial pyrolysis of hydrocarbons, the interior surface of a reactor is coated with a uniform layer of a ceramic material, the layer being deposited by thermal decomposition of a non-alkoxylated organosilicon precursor in the vapor phase, in a steam containing gas atmosphere in order to form oxide ceramics.

32 Claims, No Drawings

CERAMIC VAPOR DEPOSITED COATING USING A STEAM-CONTAINING CARRIER GAS AND NON-ALKOXY SILANE PRECURSORS

BACKGROUND OF THE INVENTION

1. Field of the Invention

The present invention relates to the thermal decomposition of compounds in contact with a metal or metal oxide surface to form a ceramic coating on the surface. In particular, the ceramic coating may be formed on a heat-resistance alloy steel or alloy steel oxide reactor for use in chemical processes by the decomposition of non-alkoxy silane precursors in the presence of steam. The present invention provides an improved chemical reactor processing environment for pyrolysis processes such as cracking or the disproportionation of hydrocarbons.

2. Discussion of the Background

Coking is a significant problem in high-temperature chemical reactions, such as the pyrolysis of hydrocarbons, particularly in the production of ethylene.

Ethylene, the lightest olefinic hydrocarbon, is the most important building block of the petrochemical industry. Ethylene is produced almost exclusively via the pyrolysis of hydrocarbons in tubular reactor coils which are externally heated by a furnace (see: Chapter 8 in *Pyrolysis of Hydrocarbons*, p.109–142, Marcel Dekker Inc., New York (1980)). High selectivity toward the production of desired olefins (i.e., ethylene and propylene) and diolefins (i.e., butadiene) with minimum methane and hydrogen production and coking in the coils leading to longer heater runs are desired. This is achieved by operating the pyrolysis heaters at high temperatures (750°–900° C.) short residence times (0.1–0.6 sec.) and low hydrocarbon partial pressures. Steam is added to the feedstock to reduce the hydrocarbon partial pressure and the amount of carbon deposited on the tube walls.

Steamless cracking has been investigated as a potential means of increasing production capacity and maximizing energy efficiencies (see "Steamless Pyrolysis of Ethane to Ethylene", Paper 101, presented at a meeting of the American Chemical Society, Boston, Mass., April 1990, by Y. Song, A. A. Leff, W. R. Kliewer and J. E. Metcalf). The work cited above was performed in a tube made entirely of silicon carbide. The use of tubes constructed of silicon carbide, however, would not be possible on an industrial scale because of the low mechanical reliability and fabrication problems of this material.

Tubular reactor coils, also known as pyrolysis heaters, are an important facet of operation to consider partly because of coke deposition (see: *Kirk-Othmer Encyclopedia of Chemical Technology*, Vol. 9, "Ethylene", J. Wiley & Sons Inc., New York (1979)). The mechanism of coke formation has been postulated (see L. F. Albright & J. C. Marck, *Ind. Eng. Chem. Res.*, vol 27, 731 and 743 (1988)), but has yet to be modeled in precise terms.

The reduction of the coking rate and the extension of the reactor run time have been the subject of several investigations and commercial applications (see for example the Products Bulletins G-262, G-5263, G-5267, G-5268 by Nalco Chem. Co., Petroleum and Process Chemical Division, 1800 Eperson Bldn.—Houston, Tex.).

For instance, the use of a silicon dioxide layer to inhibit coke formation inside thermal cracking reactors is known from UK-1,332,569 and U.S. Pat. No. 4,099,990. In particular, in U.S. Pat. No. 4,099,990, the silicon dioxide coating is obtained by thermal decomposition of an alkoxysilane in the vapor phase. The silicon dioxide coating reduces coking rates. The present invention avoids use of alkoxysilanes because of their rapid decomposition kinetics, which make it difficult to coat long tubes uniformly.

U.S. Pat. No. 3,536,776 discloses a method of reducing coke in the high temperature conversion of hydrocarbons by utilizing a reactor which is coated with a metal ceramic material containing particles of a catalytically inert, refractory solid ceramic substance dispersed in chromium. This method requires time-consuming steps which are avoided by the present invention.

U.S. Pat. No. 5,208,069 discloses a method for passivating the inner surface of hydrocarbon pyrolysis tubes by deposition of a non-oxide ceramic coating. Specific silicon-containing compounds are disclosed as precursors in the ceramic deposition process.

There remains a need for an apparatus which exhibits a reduced tendency to undergo coking. In particular, there remains a need for a method and an apparatus for pyrolyzing hydrocarbons which are free of the above-described drawbacks. There also remains a need for a method for producing such an apparatus.

SUMMARY OF THE INVENTION

Accordingly, it is an object of the present invention to provide a novel apparatus which exhibits a reduced tendency to undergo coking.

It is another object of the present invention to provide a novel apparatus for the pyrolysis of hydrocarbons which minimizes the coking rate.

It is another object of the present invention to provide a method for preparing such an apparatus.

It is another object of the present invention to provide a method of pyrolyzing hydrocarbons utilizing such an apparatus.

These and other objects, which will become apparent during the following detailed description, have been achieved by the discovery that a reduction of the coking rate in reactors which are subject to coking can be achieved by the controlled deposition, on an inner surface of the reactor, preferably a tubular reactor, of a coating derived from a non-alkoxy group-containing silane, a silazane or a siloxane compound which is volatile at temperatures below the decomposition temperature of the process in a steam-containing carrier gas atmosphere.

DETAILED DESCRIPTION OF THE PREFERRED EMBODIMENTS

Accordingly, the present invention relates to a method for treating the inner surface of a reactor which is subject to coking, wherein the surface is coated with a thin layer of an oxide ceramic material, the layer being deposited by thermal decomposition of a silicon-containing precursor in the vapor phase, in a controlled steam atmosphere.

The thus-obtained ceramic material consists essentially of silicon, oxygen, carbon and nitrogen if the precursor contains nitrogen. Minor amounts of silicon carbide, silicon oxycarbide, silicon nitride, silicon carbonitride and silicon oxynitride may form during the deposition without impairing the effectiveness of the layer. The concentration of oxygen incorporated in the ceramic layer is suitably 50 to 67 atom %, preferably 60 to 67 atom %. Moreover, free elemental carbon may be present in the ceramic composition.

The principal advantage deriving from Chemical Vapor Deposition (CVD) of thin films (see *Vapor Deposition*, Eds. C. F. Powell, J. H. Oxley, J. M. Blocher Jr., J. Wiley & Sons, N.Y. (1966)), is the atom-by-atom nature of the deposition process which eliminates outgassing problems. This process results in high film quality.

The choice of organosilicon CVD precursor compounds that are likely to serve as efficient CVD precursors is dependent on a variety of factors. The choice of the precursor must take into account such factors as the physical properties, ease of synthesis and handling, and the conditions required for thermolysis of the precursor in order to make coatings of suitable quality.

Organosilicon CVD precursors suitable for the present invention are selected from silicon compounds which are volatile at temperatures below the deposition process. These compounds will contain one or more silicon atoms with the other atoms being carbon, nitrogen, or hydrogen and can be either oxygen containing or non-oxygen containing so long as the oxygen is not present in the alkoxy group. These compounds may also contain other elements, such as chlorine. The flexibility in kinetics and decomposition mechanisms of silicon compounds affords deposition control on the reactor surface.

Suitable organosilicon precursors will contain one or more silicon atoms with the other atoms being generally carbon, nitrogen and hydrogen. Carbon can be readily supplied from the precursors, but may also be supplied from the carrier gas, allowing the use of carbon-free silicon compounds as precursors. For example, a mixture of $H_xSiCl_{4-x}$ (x=0-4) and $CH_4$ can be used. Additional precursor compounds which can be used in the present invention are described in the co-pending U.S. application Ser. No. 08/155,769, the disclosure of which is incorporated herein by reference in its entirety.

Suitable precursors for the process of the present invention may be silanes, which are organosilicon compounds containing silicon, carbon, hydrogen and, eventually halogen atoms. Suitable silanes contain from 1 to about 30 carbon atoms, preferably 1-20 carbon atoms. Silanes of this type include mono-, di-, tri- and tetra-substituted silanes containing one or more, preferably 1 to 4 silicon atoms. The substituent on these silanes may be an alkyl, aryl (i.e. phenyl) or aralkyl (i.e. benzyl) group.

The precursor compound may also be an oranosilicon compound containing nitrogen, carbon and hydrogen atoms. Preferred compounds of this type contain at least two silicon atoms, where at least two silicon atoms are bonded to a single nitrogen atom (Si—N—Si). However, these latter precursors are not limited to compounds containing only two silicon atoms and may contain a plurality of silicon atoms bonded to nitrogen atoms. Generally, such precursor compounds will contain from 2 to about 8 silicon atoms. The precursors may be cyclic or acyclic and will generally contain up to about 30 carbon atoms, preferably 1-20 carbon atoms.

In one embodiment (A) of the present invention, the precursor has the structure shown below

wherein each R is hydrogen, $C_{1-20}$ alkyl, halogen (preferably chlorine) or $NR_1R_2$ where $R_1$ and $R_2$ are hydrogen, $C_{1-8}$ alkyl or $SiR_3R_4R_5$ and $R_3$, $R_4$ and $R_5$ are independently from each other, hydrogen, $C_{1-20}$ alkyl, halogen (preferably chlorine) or $NR_1R_2$. Preferrably, $R_3$, $R_4$ and $R_5$ are $C_1$-$C_4$ alkyl, or $NR_1R_2$ and, in this latter case, compounds wherein only one of the $R_3$, $R_4$ and $R_5$ groups is $NR_1R_2$. The group X is hydrogen, lithium or $SiR_3R_4R_5$ where $R_3$, $R_4$ and $R_5$ are as defined above. Precursor compounds within this embodiment of the invention must have 2 silicon atoms bonded to a nitrogen atom. For compounds in this embodiment containing only 2 or 3 silicon atoms bonded to the same nitrogen atom, at least one group R is preferably an alkyl group containing at least 2 and up to 20, even more preferably 2-8 carbon atoms.

Preferred compounds within this embodiment of the invention are compounds in which R is $C_{1-8}$ alkyl, more preferably $C_{1-4}$ alkyl, even more preferably methyl. Among these preferred embodiments, substituent X is preferably $SiR_3R_4R_5$ where $R_3$, $R_4$ and $R_5$ are as defined above.

Specific compounds within the first embodiment include N-Li-hexamethyl disilazane, heptamethylchloro-trisilazane, 1,3-dichloro-1,1,3,3-tetramethyl disilazane, 1,2,3-trichloro hexamethyl trisilazane, ethylheptamethyl trisilazane, chloro-octamethyl trisilazane, N-lithio-1,3-dichlorotetramethyl disilazane, 1,2,3-trichloro hexamethyl trisilazane, and 1,1-dichloro-1-ethyltrimethyl disilazane.

In a second embodiment (B) of the invention, the precursor compound is cyclic and has the structure shown below

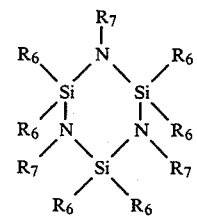

where each $R_6$ is independently hydrogen or $C_{1-20}$ alkyl; and each $R_7$ is independently hydrogen, $C_{1-20}$ alkyl (preferably $C_{1-8}$ alkyl), lithium or $SiR_8R_9R_{10}$ where $R_8$, $R_9$ and $R_{10}$ are, independently, hydrogen or $C_{1-20}$ alkyl, preferably $C_{1-8}$ alkyl, more preferably methyl. Particularly preferred compounds within this embodiment of the invention are cyclic precursors in which $R_6$ is methyl and each $R_7$, independently, is hydrogen or $SiR_8R_9R_{10}$, where $R_8$, $R_9$ and $R_{10}$ are hydrogen or methyl.

Specific examples of compounds within the second embodiment include N-dimethylsilyl-1,1,3,3,5,5-hexamethylcyclotrisilazane; bis(N-dimethylsilyl)-1,1,3,3,5,5-hexamethylcyclotrisilazane; tris(N-dimethylsilyl)-1,1,3,3,5,5hexamethylcyclotrisilazane; 1,1,3,3,5,5-hexamethyltrisilazane and N-lithio-1,1,3,3,5,5-hexamethylcyclotrisilazane.

In a third embodiment (C) of the present invention, the precursor compounds have the structure shown below

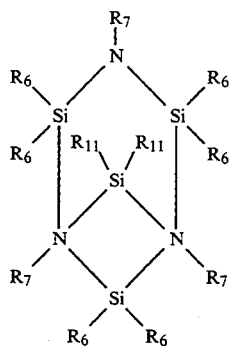

wherein $R_6$ and $R_7$ are as defined above and $R_{11}$ is hydrogen or $C_{1-20}$ alkyl, preferably $C_{1-8}$ alkyl, more preferably methyl. In the compounds of this embodiment, a fourth silicon atom forms bonds to 2 nitrogen atoms in the 6-membered ring thereby forming a bicyclic ring system.

In a fourth embodiment (D) of the invention, the precursor compounds have the cyclic structure shown below

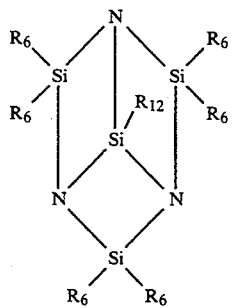

wherein $R_6$ is as defined above and $R_{12}$ is hydrogen or $C_{1-20}$ alkyl, preferably $C_{1-8}$ alkyl, more preferably methyl.

In a fifth embodiment (E) of this invention, the precursor compound has the structure shown below

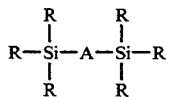

wherein R is hydrogen, $C_{1-20}$ alkyl, halogen (preferably chlorine), $NR_1R_2$ (where $R_1$ and $R_2$ are, independently, hydrogen, $C_{1-20}$ alkyl, halogen (preferably chlorine) or $SiR_3R_4R_5$ where $R_3$, $R_4$ and $R_5$ are hydrogen, $C_{1-20}$ alkyl or $NR_1R_2$); and A is a divalent alkylene, arylene or alkylarylene group. Preferably, A is a straight-chain or branched $C_{2-6}$ alkylene, a $C_{6-10}$ arylene group or a $C_{7-16}$ alkylarylene group. By "alkylarylene" is meant a group having the formula $-(CH_2)_n-Ar-(CH_2)_m-$, where Ar is a $C_{6-10}$ aryl group such as phenyl or naphthyl, and n and m are integers such that the sum of n and m has a value in the range 1-10. In compounds within this embodiment of the invention, 1, 2 or 3 of the R groups on each silicon atom bonded to A is $NR_1R_2$ and at least one of $R_1$ and $R_2$ is $SiR_3R_4R_5$. Particularly preferred are compounds in which $R_1$ and $R_2$ are both $SiR_3R_4R_5$ and $R_3$, $R_4$ and $R_5$ are methyl.

An additional embodiment (F) for use in the invention has the structure shown below.

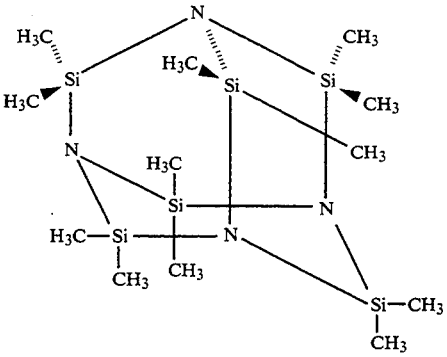

Specific examples of non-oxygen containing silicon compounds suitable as precursors for the method of the present invention are listed below: hexamethyldisilazane (HMDS), tetramethylsilane, (diethylamino)trimethylsilane, (isopropylamino)trimethylsilane, nonamethyltrisilazane, (dimethylamino)trimethylsilane, heptamethyldisilazane, bis(isopropylamino)dimethylsilane, hexamethyldisilane, tetramethyldisilazane, (diethylamino)triethylsilane, tetrakis(dimethylamino)silane, bis(dimethylamino)methylsilane, (dimethylamino)triethylsilane, trimethylsilane, (dimethylamino)benzyldimethylsilane, (2-picolylamino)trimethylsilane, tris(isopropylamino)methylsilane, dimethylsilane, bis(diethylamino)methylsilane, (dimethylamino)benzylmethylsilane, butylmethylphenylsilane, (diisopropylamino)methylchlorosilane, octamethyltrisilazane, bis(dimethylamino)phenylsilane, benzylmethylsilane, triisopropylsilane, tris(dimethylamino)methylsilane, diethylmethylsilane, triethylsilane, bis(dimethylamino)ethylsilane, hexamethyltrisilazane, and (dimethylamino)dimethylsilane.

Specific examples of oxygen containing silicon compounds suitable as precursors for the method of the present invention are listed below: hexaethyldisiloxane, tris(trimethylsilylamino)ethylsiloxane, hexamethyldisiloxane, 1,1,3,3,5-hexamethylcyclotrisiloxane, tris(trimethylsilylamino)ethylsiloxane-mono-tetramethylsilane, tris(trimethylsilylamino)ethylsiloxane-di-tetramethylsilane, tris(trimethylsilylamino)ethylsiloxane-tri-tetramethylsilane, and octamethylcyclotetrasiloxane.

Mixtures of different precursor compounds may also be used. The use of precursor mixtures allows one to use mixtures containing large amounts of inexpensive precursor compounds and minor amounts of relatively expensive precursor compounds to vary the characteristics of the ceramic coating economically. Suitably, an inexpensive precursor such as HMDS is used in amounts of about 10-90, preferably 70-90, volume % of the total precursor amount and more expensive precursors are used in the corresponding amounts of 90-10, preferably 30-10 volume %. Obviously, the specific combination of individual precursor compounds and the relative amounts of each precursor will depend upon the exact characteristics of the desired ceramic coating and vapor deposition kinetics. The specific precursors and relative amounts thereof can be readily chosen by one having ordinary skill in the art to produce the desired ceramic coating.

It has been surprisingly observed that a minor amount of a first organosilicon compound having very suitable decomposition kinetics, such as a tri(dimethylamino)ethylsilane, greatly improves the decomposition kinetics of the overall gas composition comprising a major amount of a second organosilicon compound not having excellent decomposition kinetics, but available at a much lower cost than the first compound.

The precursor compounds used in the present invention may contain impurities in minor amounts such that the overall properties of the deposited ceramic are not altered. For example, when the precursor is prepared from a lithium-containing compound, minor amounts of lithium-containing compounds may be present in the precursor without affecting the overall properties of the deposited ceramic.

The method of coating according to the present invention is carried out by simply heating one or more precursor compounds in a steam containing atmosphere, i.e., under conditions which foster the formation of oxide ceramics with minor amounts of carbon and nitrogen, thereby obtaining certain advantages in that the stoichiometry of the ceramics is controllable. It is possible that the ceramics' physical properties (i.e., thermal expansion and strength) can be influenced.

For this purpose, the steam carrier gas may contain minor amounts of other gases, such as nitrogen, argon, helium, methane, ethylene, ethane, hydrogen and mixtures thereof. Minor amounts of oxygen or oxygen-containing gases (other than steam), such as carbon dioxide and monoxide, do not impair the properties of the obtained coating. Steam is preferably present in the carrier gas in an amount from about 10 to 100 volume %.

The concentration of the precursor in the carrier gas must be adjusted so as to avoid the formation of powders. The optimum concentration thus depends on the identity of the precursor and on the operative conditions. In general the concentration is suitably less than 10.0% v/v, preferably less than 5.0% v/v.

The deposition is generally carried out at atmospheric or slightly subatmospheric pressure. Deposition is carried out by passing a flow of steam over the reactor surfaces to be coated. The reactor surfaces are heated to the desired decomposition temperature. The organosilicon precursor compounds of the invention are injected into the steam flow and are decomposed in the reactor to form the ceramic coating of the present invention. The precursors may be injected into the flowing steam using conventional injection apparatus.

To enhance adhesion of the ceramic coating to a reactor surface, the reactor surface may be initially oxidized before ceramic coating by passing a steam flow over the reactor surface for a period of time sufficient to oxidize the surface of the reactor. For example, water can be injected into an air carrier gas and passed into a furnace heated to about 600°–900° C. for about 5–25 hours to adequately oxidize metal reactor surfaces. Initial oxidation of metal reactor surfaces improves adhesion of the oxide coating of the present invention.

Because the decomposition kinetics are different for different precursors, the temperature of deposition can vary from about 600° to 1000° C., preferably about 700° to 900° C. Decomposition kinetics are directly responsible for the deposition behavior observed. It is important to note that limitations to deposition temperature are mainly imposed by engineering technical reasons: for example, the upper temperature limit for precursor deposition is determined by the upper temperature limit of the furnace. The freedom to choose among precursors possessing different decomposition characteristics affords the opportunity to accommodate the limitations of the apparatus. Through adjusting flow rate of carrier gas, it is possible to control the movement of the maximum deposition zone over the reactor length from reactor inlet to reactor outlet.

The desired thickness of the ceramic coating should be such to provide complete or near coverage of the reactor inside surface. The thickness required for having an effective coating depends on the surface of the reactor. The local thickness can be affected by surface roughness. Typically, coatings of 1 to 20 $\mu$m are used.

Thus, the present invention is characterized by the following advantages and features:

(1) The precursors of the invention provide flexibility in decomposition kinetics over alkoxysilanes which allows production of more uniform ceramic coatings.

(2) The ceramic coating retards the formation of coke deposits by the passivation of the catalytically active metal surfaces which are present in reactor coils in steam or steamless hydrocarbon pyrolysis reactors. A first consequence is an increase in productivity of ethylene, since the reduction in coking rate increases the duration between decoking cycles.

(3) Significant operation cost savings are realized since the decrease in the rate of coke formation also decreases the amount of energy required in the form of heat and therefore less fuel is consumed.

(4) The presence of the ceramic layer may upgrade the carburization resistance of steam cracker alloy tubing, resulting in a cost savings from less frequent tube replacements.

(5) With respect to adherence, the relative thermal expansion coefficients of the ceramic coating and the reactor surface provides an increase in the operative life of the coating itself.

(6) Another advantage of in-situ precursor chemical vapor deposition is that more coating can be applied if and when coating failure occurs.

It is to be understood that, although the present method is particularly well suited for the coating of apparatus used in the pyrolysis of hydrocarbons, particularly in the production of ethylene, the present method may be beneficially applied to any apparatus which is subject to coking.

The present invention also relates to apparatuses which are subject to coking. In a preferred embodiment, the apparatus possesses at least one reactor tube of which a surface is coated with a layer of a ceramic material consisting essentially of silicon, oxygen, carbon and nitrogen. Minor amounts of silicon carbonitride, silicon oxycarbide, silicon carbide, silicon nitride and silicon oxynitride may form during the deposition without impairing the effectiveness of the layer. Thus, the mole fraction of oxygen incorporated in the ceramic layer is suitably 50 to 67 atom %, preferably 60 to 67 atom %. The amount of free carbon is suitably 0 to 30 atom %, preferably 0 to 10 atom %.

A general discussion of apparatuses used for the pyrolysis of hydrocarbons is given in *Kirk-Othmer Encyclopedia of Chemical Technology*, vol. 9, "Ethylene", pp 393–431, Wiley N.Y. (1980), which is incorporated herein by reference. A discussion of the apparatus and reaction condition parameters to be considered when maximizing the production of ethylene in hydrocarbon pyrolysis is provided in *L. E. Chambers et al, Hydrocar-* bon Processing, January 1974, pp. 121–126, which is also incorporated herein by reference.

It is preferred that the present apparatus be for the pyrolysis of hydrocarbons. It is particularly preferred that the present apparatus be for the steam containing or steamless production of ethylene by cracking.

The present invention also relates to a method of pyrolyzing a hydrocarbon by utilizing a reactor in which the inner surface is coated with a layer of the ceramic material of the invention.

As noted above, a general discussion of the pyrolysis of hydrocarbon is provided in Kirk-Othmer Encyclopedia of Chemical Technology, vol. 9, pp. 393–431, Wiley, N.Y. (1980). Thus, the present method of pyrolysis may utilize a variety of feedstocks such as ethane, propane, or multicomponent hydrocarbon feedstocks (e.g., natural gas liquids, naphthas, and gas oils). The particular conditions utilized, such as temperature, pressure, residence time, flow rate, etc., will depend on the particular geometry and characteristics of the reactor and identity of the feedstock being used. Selection of the appropriate reaction conditions is within the abilities of one having ordinary skill in this art. Preferably, the present method for pyrolyzing hydrocarbons is either the steam-containing or steamless production of ethylene.

The precursor compounds of the present invention are commercially available or can be prepared by reactions using commonly available starting materials such as hexamethyl disilazane (HMDS) and hexamethyl cyclotrisilazane (HMCTS) which are commercially available. HDMS has the structure shown below.

HMDS and corresponding disilazanes can be readily N-lithiated by reaction with an organolithium reagent such as n-butyllithium in dry inert solvents such as hydrocarbons and ethers. The N-lithio-disilazane is then reacted with a chlorosilane to produce compounds having 3 silicon atoms bonded to a single nitrogen atom. Suitable chlorosilanes have the structure Cl—SiR$_3$R$_4$R$_5$ where R$_3$, R$_4$ and R$_5$ are hydrogen, halogen or C$_{1-20}$ alkyl. The chlorosilane may contain 1, 2 or 3 chlorine atoms. Suitable chlorosilanes include ethyl dichlorosilane, diethyldichlorosilane, methyldichlorosilane, dimethylchlorosilane, etc. When the chlorosilane contains 2 or 3 chlorine atoms, the product obtained by reacting the N-lithio-disilazane with the chlorosilane will contain unreacted Cl—Si bonds which can be further reacted with N-lithiated disilazane to increase the number of silicon atoms in the precursor. N-lithio-disilazane and other compounds containing a Cl—Si bond can also be reacted with Grignard reagents having the structure R—MgBr where R is C$_{1-20}$ alkyl, preferably C$_{2-20}$ alkyl, more preferably C$_{2-8}$ alkyl to introduce alkyl groups having two or more carbon atoms into the product. Alternatively, compounds containing a Cl—Si bond may be reacted with an organolithium reagent having the formula R—Li where R is C$_{1-20}$ alkyl, preferably C$_{2-20}$ alkyl, more preferably C$_{2-8}$ alkyl.

Similarly, the cyclic precursors of the present invention are prepared by first lithiating cyclotrisilazanes such as HMCTS with an organolithium reagent in a dry inert solvent. The N-lithiated cyclotrisilazane is then reacted with a chlorosilane in the same manner as described above. Bicyclic precursors are formed by reacting a bis(N-lithio)cyclotrisilazane with a chlorosilane or chlorosilazane having two chlorine atoms. For example, N-dimethylsilylcyclotrisilazane can be reacted with two equivalents of n-butyllithium to form bis(N-lithio)-N-dimethylsilyltrichlorosilazane. The bis(N-lithio) compound can then be reacted with methyl dichlorosilane to form a precursor of embodiment (C) where each R$_6$ is methyl, one R$_{11}$ is hydrogen and the other R$_{11}$ is methyl and R$_7$ is dimethylsilyl. Similarly, tris(N-lithio)-cyclotrisilazanes are reacted with chlorosilanes having three chlorine atoms to form the cyclic compounds of embodiment (D). In an analogous reaction, tris(N-lithio)-HMCTS is reacted with 1,2,3-trichlorohexamethyltrisilazane to form the compound of embodiment (F).

In a similar manner, the compounds of embodiment (E) are prepared by reacting a chlorosilane with a divalent Grignard reagent or divalent organolithium reagent having the structure BrMg—A—MgBr or Li—A—Li. These divalent organometallic reagents are prepared by conventional methods, i.e. reacting the corresponding dihalo compounds with magnesium or lithium.

Having generally described this invention, a further understanding can be obtained by reference to certain specific examples which are provided herein for purposes of illustration only and are not intended to be limiting unless otherwise specified.

EXAMPLES

Example 1

A general description for deposition a coating is as follows:

The organosilicon precursor dimethylaminotriethylsilane (C$_8$H$_{21}$SiN) was synthesized with a purity of 99% and a boiling point of 118° C. at 15 torr. The liquid precursor, from a syringe placed in a computer-controlled pump, was injected into a steam containing carrier gas stream to be transported into a three-zone furnace. The unit used 0.7 cm i.d.×1 m long quartz tubes in order to establish visually the location and extent of coating. The furnace was controlled such that a temperature of operation existed above that of the decomposition temperature of the precursor (>720° C.).

Dimethylaminotriethylsilane/steam carrier gas was passed through the tubing (1000 cc/min for 32 minutes) at a concentration of 2.0 w/w. The result was black, adherent coating, that microscopic observation revealed to be smooth and continuous. The thickness of the coating was determined to be 2 to 12 μm. A section of tubing, associated with the decomposition, was observed to be darkest in a location where the temperature in the gradient furnace had been held at 720° C. or more. This deposition zone is dependent on the rate of injection, flow rate (residence time) and/or the temperature. Using these variables it is possible to coat the full length of a tube.

Example 2

This experiment was conducted in the same reactor using the same precursor conditions described in Example 1. In this case, INCOLOY 800H tubes (0.774 cm i.d.×0.089 cm wall×1 m long) were used to more closely simulate conditions found in industrial applications. The metal tubes were oxidized before CVD coating by injecting water at 100 μl/min into a carrier gas of air at 400 cc/min into an 800° C. furnace for 16 hours and 40 min.

(Dimethylamino)triethylsilane/steam was passed through tubing under the conditions described in Example 1. The result was a black, adherent coating, that microscopic observation revealed to be smooth and continuous. Thickness of the coating was determined to be 4 to 16 μm.

Example 3

This experiment was conducted in the same reactor described in Example 1. In this case, the organosilicon precursor 1,1,3,3,5-hexamethylcyclotrisiloxane (boiling point 186° C.) was passed through tubing (1000 cc/min for 32 minutes). The result was black, adherent coating, that microscopic observation revealed to be smooth and continuous. The thickness of the coating was determined to be 3 to 19 μm.

Example 4

This experiment was conducted in the same reactor described in Example 1. In this case, the organosilicon precursor hexaethyldisiloxane was passed through tubing (1000 cc/min for 32 minutes). The result was black, adherent coating, that microscopic observation revealed to be smooth and continuous. The thickness of the coating was determined to be 2 to 15 μm.

Example 5

To test the coke mitigating ability of the above ceramic coating, test coupons of 1 inch×14 inch×1/16 inch in size were cut from substrates of 304 stainless steel. The coupons were inserted into the quartz tube furnace and coated according to the conditions in Example 1. Part of the coating was removed to expose the underlying metal surface. All coupons were then inserted into a stainless steel tube in an ethylene steam cracking reactor and subjected to rapid coking conditions. Coking of the exposed sections of coupons was observed while no significant coking occurred on the coated coupon sections.

Example 6

A comparative study was made of the amount of coke formed in oxidized INCOLOY-800 tubing versus ceramic coated INCOLOY-800 tubing. Cracking experiments were performed using 0.375" o.d.×0.305" i.d. tubing with a heated length of approximately 150 cm. The ceramic coated tube was prepared by the method described in Example 1. The uncoated tube was oxidized overnight at 850° C. in flowing air. The conditions of cracking were: butane/steam, ratio of 60/40 (vol.%) with a residence time of 7.5 seconds at 850° C. for 6 hours. The increase in weight resulting from the cracking operation was found to be only 75 mg for the coated tube but 400 mg for the uncoated tube. This difference took into account the pretest weight gains: from the ceramic coating in the case of the coated tube (approximately 71 mg), and from oxidation of the metal in the case of the uncoated tube (approximately 9 mg). Therefore the ceramic coating reduced the coking rate more than five times with respect to the uncoated tube.

These results indicate that the ceramic coating reduces the amount of coke formation on the inside of reactor tubes.

Example 7

This experiment was conducted in the same reactor using the same conditions described in Example 2. In this case two tubes were treated simultaneously with the difference being only the makeup of the precursor. Only hexamethyldisilazane (HMDS) was used in tube A whereas a mixture of two precursors, 40 volume percent HMDS and 60 volume percent tris(dimethylamino)ethylsilane (EM-SiN3), was used in tube B. The method for passing precursor/steam through tubing is described in Example 1. The results in both tube A and tube B were black, adherent coatings that microscopic observation revealed to be smooth and continuous. HMDS is known to possess a higher decomposition temperature than EM-SiN3 and is about ten times less expensive to prepare.

The difference in film thickness realized from using a precursor mixture is shown in Table 1. The coating in tube B produced from the EM-SiN3/HMDS mixture was 3 times as thick as the coating produced from HMDS alone. This result indicates that an EM-SiN3/HMDS mixture was effective in realizing cost savings. This is because the performance of the precursor that is inexpensive to synthesize was bolstered by a fractional addition of a more expensive one. The desired features of the precursor which is expensive to synthesize (EM-SiN3) were not altered significantly by dilution with a precursor of far less value (HMDS).

Example 8

This experiment was conducted in the same reactor using the same conditions described in Example 2. In this case two tubes were treated simultaneously with the difference being only the makeup of the precursor. Only hexamethyldisilazane (HMDS) was used in tube A whereas a mixture of three precursors, 90 volume percent HMDS and 5 volume percent tris(dimethylamino)ethylsilane (EM-SiN3) and 5 volume percent tris(monomethylamino)ethylsilane (EM-SiNH3), was used in tube B. The method for passing precursor/steam through tubing is described in Example 1. The results in both tube A and tube B were black, adherent coatings that microscopic observation revealed to be smooth and continuous. HMDS is known to possess a higher decomposition temperature than EM-SiN3 or EM-SiNH3 and is about ten times less expensive to prepare.

The difference in film thickness realized from using a precursor mixture is shown in Table 1. The coating in tube B produced from the HMDS/EM-SiN3/EM-SiNH3 mixture was 50% as thick as the coating produced from HMDS alone. This result indicates that an HMDS/EM-SiN3/EM-SiNH3 mixture was effective in realizing cost savings. This is because the performance of the precursor that is inexpensive to synthesize was bolstered by a fractional addition of a combination of more expensive ones.

TABLE 1

| Chemical Precursor | Isothermal Temperature (°C.) | Residence Time (sec, cm) | FTIR Peak Time (sec) | FTIR Peak Height (e.g. thickness, um) |
| --- | --- | --- | --- | --- |
| Hexamethyldisilazane (HMDS) | 825 | 1.2 @ 97 | 0.6 | 1 |
| tris(dimethylamino)-ethylsilane | 825 | 0.7 @ 76 | 0.4 | 4 |

TABLE 1-continued

| Chemical Precursor | Isothermal Temperature (°C.) | Residence Time (sec, cm) | FTIR Peak Time (sec) | FTIR Peak Height (e.g. thickness, um) |
|---|---|---|---|---|
| 40 volume % HMDS/ 60 volume % (EM-SiN3) | 825 | 1.2 @ 97 | 1.2 | 3 |
| 5 volume % tris(monomethylamino)-ethylsilane (EMSiNH3) 5 volume % EM-SiN3 90 volume % HMDS | 825 | 1.2 @ 97 | 0.6 | 1.5 |

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for passivating a surface of a chemical reactor subject to coking, comprising decomposing an organosilicon precursor compound in the vapor phase inside the reactor, in a steam-containing carrier gas atmosphere to form a thin layer of a ceramic material on the surface of the chemical reactor, wherein said precursor is an organosilicon compound which does not contain an alkoxy group.

2. The method of claim 1, wherein said precursor is an organosilicon compound containing nitrogen, carbon and hydrogen atoms.

3. The method of claim 2, wherein said precursor contains at least two silicon atoms, wherein at least two silicon atoms are bonded to a single nitrogen atom.

4. The method of claim 1, wherein said precursor is a silane having 1 to about 30 carbon atoms.

5. The method of claim 2, wherein said precursor is a silane having 1 to about 20 carbon atoms.

6. The method according to claim 1, wherein said ceramic material consists essentially of silicon, carbon, oxygen and nitrogen or silicon, carbon and oxygen, and said ceramic material contains 50 to 67 atomic % of oxygen and 0 to 30 atomic % of free elemental carbon.

7. The method according to claim 1, wherein said precursor is a silicon compound which is volatile at temperatures below those employed in the decomposition process.

8. The method of claim 1, wherein said precursor has the structure shown below

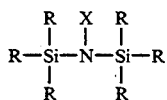

wherein each R is, independently, hydrogen, $C_{1-20}$ alkyl, halogen or $NR_1R_2$, where $R_1$ and $R_2$ are hydrogen, $C_{1-20}$ alkyl or $SiR_3R_4R_5$ where $R_3$, $R_4$ and $R_5$ are independently hydrogen, $C_{1-20}$ alkyl, halogen or $NR_1R_2$ and X is H or $SiR_3R_4R_5$ with the proviso that the precursor is not hexamethyldisilazane.

9. The method of claim 8, wherein said precursor is selected from the group consisting of heptamethylchlorotrisilazane, 1,3-dichloro-1,1,3,3-tetramethyl disilazane, 1,2,3-trichloro hexamethyl trisilazane, ethylheptamethyl trisilazane, chloro-octamethyl trisilazane, nonamethyl trisilazane, 1,2,3-trichloro hexamethyl trisilazane, and 1,1-dichloro-1-ethyl-trimethyl disilazane.

10. A method for passivating a surface of a chemical reactor subject to coking, comprising decomposing an organosilicon precursor in the vapor phase inside the reactor, in a steam-containing carrier gas atmosphere to form a thin layer of a ceramic material on the surface of the chemical reactor, wherein said precursor is an organosilicon compound which does not contain an alkoxy group, and wherein said precursor has the structure shown below

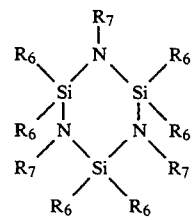

wherein each $R_6$ is independently hydrogen or $C_{1-20}$ alkyl, and each $R_7$ is independently hydrogen or $SiR_8R_9R_{10}$, wherein $R_8$, $R_9$ and $R_{10}$ are independently hydrogen or $C_{1-20}$ alkyl.

11. The method of claim 10, wherein said precursor is selected from the group consisting of N-dimethylsilyl-1,1,3,3,5,5-hexamethyl-cyclotrisilazane; bis(N-dimethylsilyl)-1,1,3,3,5,5-hexamethyl-cyclotrisilazane; tris(N-dimethylsilyl)-1,1,3,3,5,5-hexamethylcyclotrisilazane; and 1,1,3,3,5,5-hexamethyltrisilazane.

12. A method for passivating a surface of a chemical reactor subject to coking, comprising decomposing an organosilicon precursor in the vapor phase inside the reactor, in a steam-containing carrier gas atmosphere to form a thin layer of a ceramic material on the surface of the chemical reactor, wherein said precursor is an organosilicon compound which does not contain an alkoxy group, and wherein said precursor has the structure shown below

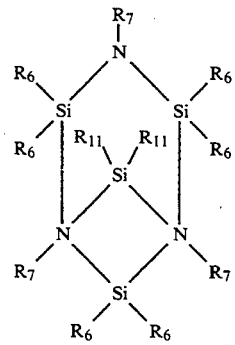

wherein each $R_6$ is independently hydrogen or $C_{1-20}$ alkyl, and each $R_7$ is independently hydrogen or $SiR_8R_9R_{10}$, wherein $R_8$, $R_9$ and $R_{10}$ are, independently, hydrogen or $C_{1-20}$ alkyl, and $R_{11}$ is hydrogen or $C_{1-20}$ alkyl.

13. The method of claim 10, wherein $R_6$, $R_7$ and $R_{11}$ are independently $C_{1-8}$ alkyl.

14. A method for passivating a surface of a chemical reactor subject to coking, comprising decomposing an organosilicon precursor in the vapor phase inside the reactor, in a steam-containing carrier gas atmosphere to form a thin layer of a ceramic material on the surface of the chemical reactor, wherein said precursor is an organosilicon compound which does not contain an alkoxy group, and wherein said precursor has the structure shown below

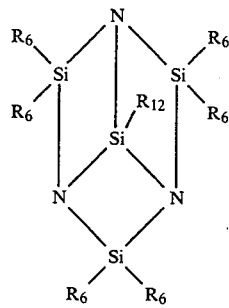

wherein $R_6$ and $R_{12}$ are independently hydrogen or $C_{1-20}$ alkyl.

15. The method of claim 14, wherein $R_6$ and $R_{12}$ are independently $C_{1-8}$ alkyl.

16. The method of claim 1, wherein said precursor has the structure shown below

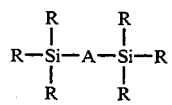

wherein each R is independently hydrogen, $C_{1-20}$ alkyl, halogen or $NR_1R_2$, wherein $R_1$ and $R_2$ are independently hydrogen, $C_{1-20}$ alkyl, halogen or $SiR_3R_4R_5$ where $R_3$, $R_4$ and $R_5$ are independently hydrogen, $C_{1-20}$ alkyl, halogen or $NR_1R_2$; and A is a divalent alkylene, arylene or alkylarylene group.

17. The method of claim 16, wherein R, $R_1$ and $R_2$ are $C_{1-8}$alkyl and A is $C_{2-6}$ alkylene, $C_{6-10}$ arylene or $C_{8-16}$ alkylarylene.

18. The method of claim 1, wherein said carrier gas is a mxiture of steam and a gas selected from the group consisting of nitrogen, argon, helium, methane, ethylene, ethane, hydrogen, carbon dioxide, carbon monoxide and mixtures thereof.

19. The method of claim 18, wherein the concentration of steam in said mixture is in the range between about 10 and 100 volume %.

20. The method of claim 1, wherein said carrier gas is steam.

21. The method of claim 19, wherein said carrier gas is a mixture of steam and nitrogen.

22. The method of claim 19, wherein said carrier gas is a mixture of steam, carbon monoxide and carbon dioxide.

23. The method of claim 1, wherein the concentration of said precursor in said carrier gas is less than 10.0 volume percent.

24. The method of claim 23, wherein the concentration of said precursor in said carrier gas is less than 5.0 volume percent.

25. The method of claim 4, wherein said process is thermal decomposition carried out at a temperature of between 600° and 1000° C.

26. The method of claim 25, wherein said temperature is between 700° and 900° C.

27. The method according to claim 2, wherein said precursor is selected from the group consisting of hexamethyldisilazane, tetramethylsilane, (diethylamino)trimethylsilane, nonamethyltrisilazane, (isopropylamino)trimethylsilane, (dimethylamino)trimethylsilane, heptamethyldisilazane, bis(isopropylamino)dimethylsilane, hexamethyldisilane, tetramethyldisilazane, (diethylamino)triethylsilane, tetrakis(dimethylamino)silane, bis(dimethylamino)methylsilane, (dimethylamino)triethylsilane, trimethylsilane, (dimethylamino)benzyldimethylsilane, (2-picolylamino)trimethylsilane, tris(dimethylamino)triethylsilane, tris(isopropylamino)methylsilane, dimethylsilane, bis(diethylamino)methylsilane, (dimethylamino)benzylmethylsilane, butylmethylphenylsilane, (diisopropylamino)methylchlorosilane, octamethyltrisilazane, bis(dimethylamino)phenylsilane, benzylmethylsilane, triisopropylsilane, tris(dimethylamino)methylsilane, diethylmethylsilane, triethylsilane, bis(dimethylamino) ethylsilane, hexamethyltrisilazane, and (dimethylamino)dimethylsilane.

28. The method of claim 1, wherein said precursor is selected from the group consisting of hexaethyldisiloxane, tris(trimethylsilylamino)ethylsiloxane, hexamethyldisiloxane, 1,1,3,3,5-hexamethylcyclotrisiloxane, tris(trimethylsilylamino)ethylsiloxane-mono-tetramethylsilane, tris(trimethylsilylamino)ethylsiloxane-di-tetramethylsilane, tris(trimethylsilylamino)ethylsiloxane-tri-tetramethylsilane, and octamethylcyclotetrasiloxane.

29. The method of claim 27, wherein said precursor is hexamethyldisilazane.

30. The method of claim 27, wherein said precursor is dimethylaminotriethylsilane.

31. The method of claim 27, wherein said precursor is tris(dimethylamino)triethylsilane.

32. The method of claim 2, wherein said precursor consists of a mixture of 30-10 volume % of at least one first compound selected from the group consisting of tris(dimethylamino)ethylsilane, bis(dimethylamino)diethylsilane, dimethylaminoethylsilane and tris(monomethylamino)ethylsilane, and 70-90 volume % of a precursor different than said first compound.

* * * * *